(12) United States Patent
McLellan et al.

(10) Patent No.: US 8,564,122 B2
(45) Date of Patent: Oct. 22, 2013

(54) CIRCUIT BOARD COMPONENT SHIM STRUCTURE

(75) Inventors: Neil R. McLellan, Austin, TX (US); Liane Martinez, Newmarket (CA); Yip Seng Low, Thornhill (CA); Suming Hu, North York (CA)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 53 days.

(21) Appl. No.: 13/316,040

(22) Filed: Dec. 9, 2011

(65) Prior Publication Data

US 2013/0147012 A1    Jun. 13, 2013

(51) Int. Cl.
*H01L 23/10*    (2006.01)

(52) U.S. Cl.
USPC .................... 257/707; 438/122; 257/E21.105

(58) Field of Classification Search
USPC ........................ 438/122; 257/707, E23.105
See application file for complete search history.

(56) References Cited

U.S. PATENT DOCUMENTS

| | | | |
|---|---|---|---|
| 5,043,533 A | | 8/1991 | Spielberger |
| 5,583,748 A | * | 12/1996 | Gochi et al. ................. 361/784 |
| 8,012,874 B2 | | 9/2011 | Li et al. |
| 8,153,903 B2 | * | 4/2012 | Kanouda et al. .............. 174/255 |
| 2002/0074653 A1 | | 6/2002 | Khandros et al. |
| 2006/0108607 A1 | | 5/2006 | Teshima et al. |
| 2006/0138591 A1 | | 6/2006 | Amey, Jr. et al. |
| 2007/0230115 A1 | * | 10/2007 | Dobritz et al. ................ 361/688 |

OTHER PUBLICATIONS

Toshisumi Yoshino et al.; Hitachi Chemical Co., Ltd.; *Advanced Photo-definable Solder Mask for High-performance Semiconductor Packages*; Jan. 2006; pp. 29-34.

Taiyo Ink Mfg. Co., Ltd.; *PSR-4000 AUS703 Material Safety Sheet*; Oct. 19, 2007; pp. 1-6.

* cited by examiner

*Primary Examiner* — Trung Q Dang

(74) *Attorney, Agent, or Firm* — Timothy M. Honeycutt

(57) ABSTRACT

Various circuit boards and methods of fabricating the same are disclosed. In one aspect, a method of manufacturing is provided that includes coupling an electrically non-functional component to a surface of a first circuit board. The electrically non-functional component has a first elevation. The surface of the circuit board is adapted to have a semiconductor chip mounted thereon. An electrically functional component is mounted to the surface inward from the electrically non-functional component. The electrically functional component has a second elevation less than the first elevation.

24 Claims, 5 Drawing Sheets

CIRCUIT BOARD COMPONENT SHIM STRUCTURE

BACKGROUND OF THE INVENTION

1. Field of the Invention

This invention relates generally to semiconductor processing, and more particularly to circuit boards for carrying semiconductor chips and to methods of making the same.

2. Description of the Related Art

All integrated circuits require electrical power to operate, and packaged integrated circuits, which consist of a semiconductor chip mounted on a package substrate, are no exception. Power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by other devices coupled to the power supply, electromagnetic interference and other causes.

Packaged integrated circuits use decoupling capacitors to lower noise on the power supply. Some of these decoupling capacitors are located on the package substrate. A typical conventional decoupling capacitor consists of a stack of plates commonly connected to two terminals. The capacitor is mounted to a package substrate by way of a pair of solder capacitor pads: one for each terminal. The capacitor pads are positioned on and electrically connected to corresponding conductor pads. The conductor pads are connected to various conductor lines or traces in the substrate that link up electrically with the semiconductor chip.

For some conventional semiconductor chip packages, the semiconductor chip is thinned prior to mounting to the package substrate. This is conventionally done by backside grinding to reduce the thickness of the semiconductor chip by sometimes several hundred microns. The thinning process may be carried out for different reasons, such as the preparation of the semiconductor chip for through-silicon via fabrication or the deliberate reduction in the height of the semiconductor chip in order to accommodate package placement in electronic devices with cramped internal spaces, such as notebook computers. Thinned semiconductor chips, while structurally smaller than their full sized counterparts, nevertheless can still dissipate significant amounts of heat and thus require thermal management in the form of heat sinks or the like.

A difficulty associated with a conventional semiconductor chip device that incorporates a thinned semiconductor chip on a package substrate is the potential for interference between the passive devices, such as the capacitors mounted on the upper surface of the substrate, and the overlying heat sink, which is typically fabricated from a conductive metal. In an unthinned semiconductor chip scenario, the upper surfaces of the passive components are normally a comfortable distance below the upper surface of the semiconductor chip and the potential for the overlying heat sink to contact one of the passive components due to asymmetric loading and rocking of the heat sink is relatively low. However, in a thinned semiconductor chip environment, the upper surfaces of the passive components may approach the elevation of the upper surface of the semiconductor chip. In this circumstance, if the heat sink is rocked to one side or the other due to asymmetric loading or other forces, there is the potential for the heat sink to contact one of the passive devices and result in a short, which can produce device failure.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes coupling an electrically non-functional component to a surface of a first circuit board. The electrically non-functional component has a first elevation. The surface of the circuit board is adapted to have a semiconductor chip mounted thereon. An electrically functional component is mounted to the surface inward from the electrically non-functional component. The electrically functional component has a second elevation less than the first elevation.

In accordance with another aspect of an embodiment of the present invention, a method of manufacturing is provided that includes coupling an electrically non-functional component to a surface of a circuit board. The electrically non-functional component has a first elevation. An electrically functional component is coupled to the surface inward from the electrically non-functional component. The electrically functional component has a second elevation less than the first elevation. A semiconductor chip is coupled to the surface inward from the electrically functional component.

In accordance with another aspect of an embodiment of the present invention, an apparatus is provided that includes a first circuit board that has a surface adapted to have a semiconductor chip mounted thereon. An electrically non-functional component is coupled to the surface and has a first elevation. An electrically functional component is coupled to the surface inward from the electrically non-functional component. The electrically functional component has a second elevation less than the first elevation.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a substrate or circuit board capable of receiving a semiconductor chip are described herein. One example includes a circuit board with a series of electrically non-functional components mounted on an upper surface. A series of electrically functional components is positioned inward from the electrically non-functional components. The electrically non-functional components act as a mechanical stop or shim to prevent an overlying heat sink from contacting the electrically functional components. Additional details will now be described.

Figure 1:
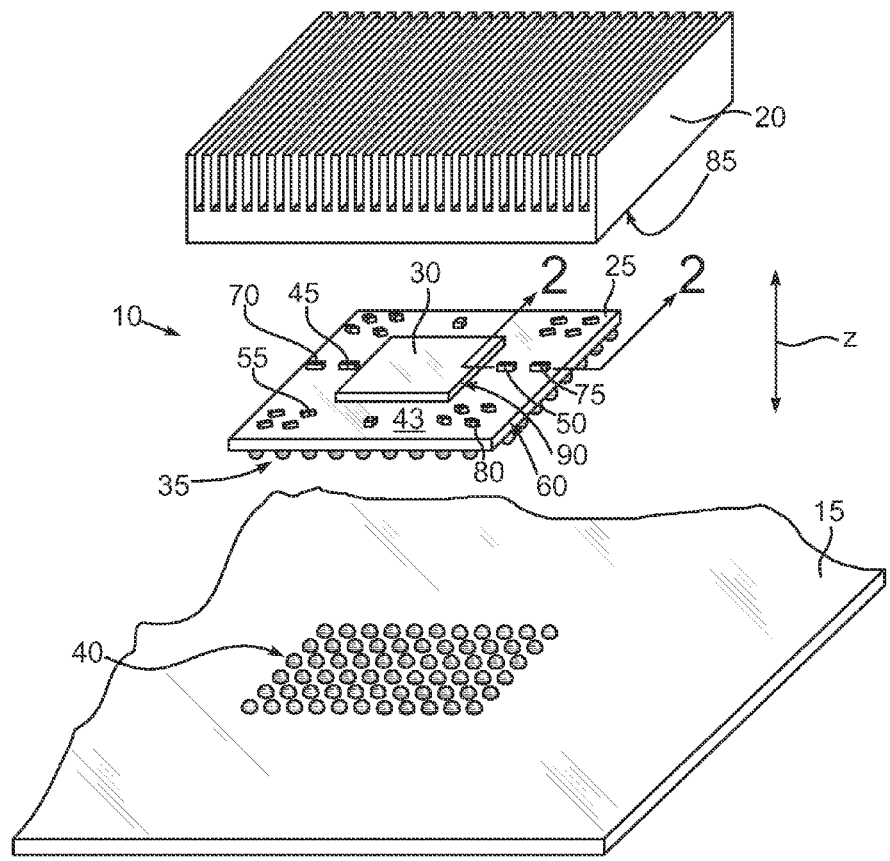
FIG. 1 is a partially exploded pictorial view of an exemplary embodiment of a semiconductor chip device that may be mounted to a circuit board and utilize a heat sink.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip device 10 that may be mounted to a circuit board 15 and has a heat sink 20 mounted thereon. Note that only a portion of the circuit board 15 is depicted for simplicity of illustration. Functionally speaking, the circuit board 15 may be a system board, such as a motherboard, a circuit card or virtually any other type of printed circuit board.

The heat sink 20 may take on virtually a limitless number of configurations and be composed of a variety of thermally conductive materials such as well-known ceramics or metallic materials as desired. Some exemplary materials include copper, nickel plated copper, anodized aluminum, aluminum-silicon-carbon, aluminum nitride, boron nitride or the like.

The semiconductor chip device 10 may include a circuit board 25 upon which one or more semiconductor chips, such as the semiconductor chip 30, may be mounted. The circuit board 25 may be a semiconductor chip package substrate, a circuit card, a pinned socket adapter, or virtually any other type of printed circuit board. Although a monolithic structure could be used for the circuit board 25, a more typical configuration will utilize a build-up design. In this regard, the circuit board 25 may consist of a central core upon which one or more build-up layers are formed and below which an additional one or more build-up layers are formed. The core itself may consist of a stack of one or more layers. If implemented as a semiconductor chip package substrate, the number of layers in the circuit board 25 can vary from four to sixteen or more, although less than four may be used. So-called "coreless" designs may be used as well. The layers of the circuit board 25 may consist of an insulating material, such as various well-known epoxies, interspersed with metal interconnects. A multi-layer configuration other than buildup could be used. Optionally, the circuit board 25 may be composed of well-known ceramics or other materials suitable for package substrates or other printed circuit boards. The circuit board 25 may be provided with a number of conductor traces and vias and other structures (not visible) in order to provide power, ground and signals transfers between the semiconductor chip 30 and another device, such as the circuit board 15 for example. To interface the circuit board 25 with the circuit board 15, an interconnect scheme, such as the depicted ball grid array consisting of plural solder balls 35, may be used to establish solder joints with a corresponding array of solder pads 40 on the circuit board 15. However, the skilled artisan will appreciate that pin grid arrays, land grid arrays or other types of interconnect structures may be used to interface the circuit board 25 with the circuit board 15.

The semiconductor chip 30 may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The semiconductor chip 30 may be constructed of bulk semiconductor, such as silicon or germanium, or semiconductor-on-insulator materials, such as silicon-on-insulator materials.

The upper surface 43 of the circuit board 25 may be populated by a plurality of components. As described more fully below, the components may be passive devices, such as capacitors, inductors or resistors, active components, such as integrated circuits, or electrically non-functional components, such as electrically non-functional capacitors, inductors, resistors or even small pieces of semiconductors or metals. Those components nearer to the semiconductor chip 30 such as the components 45, 50 and 55 for example, may be electrically functional and thus connected to electrical conductor structures in the circuit board 25 (not visible), such as, power or ground to provide various functions, such as decoupling capacitance or other electronic functions. In contrast, one or more of the components that are located nearer to a perimeter 60 of the circuit board 25, such as the components 70, 75 and 80, are advantageously fabricated to be electrically non-functional or floating and have a higher elevation, say along the z-axis, than the components 45, 50 and 55. The perimeter-located components 70, 75 and 80, for example, are designed to provide a mechanical stop or limit to prevent an undersurface 85 of the heat sink 20 from contacting the electrically connected components 45, 50 and 55 for example.

Figure 2:
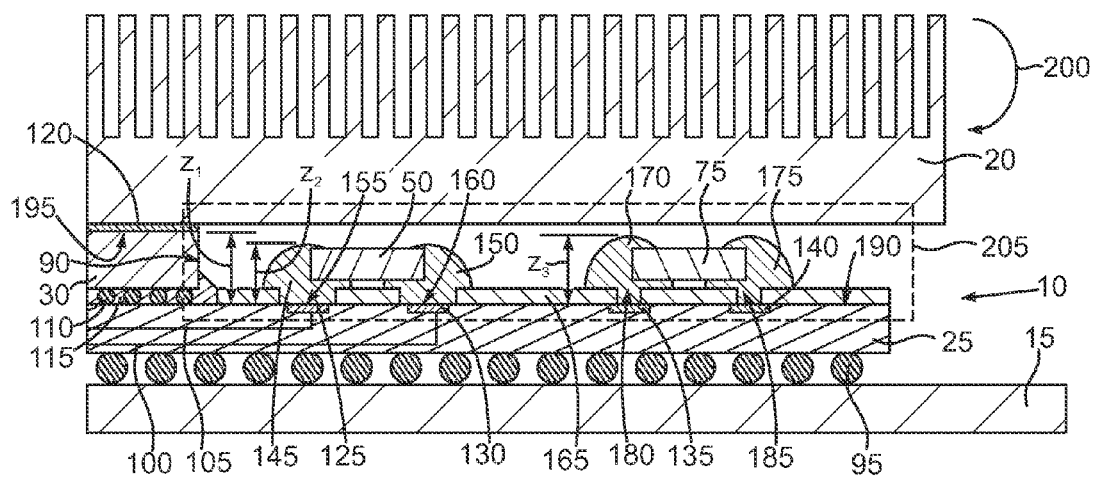
FIG. 2 is a sectional view of FIG. 1 taken at section 2-2.

Additional details of the semiconductor chip device 10 may be understood by referring now also to FIG. 2, which is a sectional view of FIG. 1 taken at section 2-2. Before turning to FIG. 2 in earnest, it should be noted that section 2-2 passes through a small portion of the semiconductor chip 30, including an edge 90 thereof, portions of the circuit boards 15 and 25 and the heat sink 20, and the full spans of the components 50 and 75. The metallurgical combination of the solder balls 35 of the circuit board 25 and the solder pads 40 of the circuit board 15 depicted distinctly in FIG. 1 are represented schematically by the solder joints 95 in FIG. 2. The solder joints 95 are electrically connected to various conductive traces and vias (not shown) in the circuit board 15 as well as various conductive traces and vias in the circuit board 25 that are not shown. However, a couple of semiconductor lines 100 and 105 are depicted schematically in the circuit board 25 and will be used to describe various functions momentarily. The semiconductor chip 30 may be flip-chip mounted to the circuit board 25 and connected electrically thereto by way of plural solder joints 110. Prior to mounting, the semiconductor chip 30 may be thinned by lapping, chemical mechanical polishing or other material removal techniques. The solder joints 110 may be composed of well-known lead-based or lead-free solders, conductive pillars or other interconnect structures. An exemplary lead-based solder may have a composition at or near eutectic proportions, such as about 63% tin and 37% lead. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. An underfill material 115 may be interspersed between the semiconductor chip 30 and the circuit board 25 to reduce the effects of differences in coefficients of thermal expansion among the various components of the semiconductor chip device 10. The underfill 115 may be composed of well-known epoxy materials, such as epoxy resin with or without silica fillers and phenol resins or the like. Two examples are types 8437-2 and 2BD available from Namics. A thermal interface material 120, such as a thermal grease, a thermal paste, or even a metallic material may be positioned between the semiconductor chip 30 and the heat sink 20 to establish a thermally conductive pathway.

The circuit board 25 may include plural metallization layers, an uppermost of which may include conductive pads 125, 130, 135 and 140. There may be scores, hundreds or more of the pads 125, 130, 135 and 140 slated for electrical connection to the various components such as the components 50 and 75 depicted in FIG. 2. Here, the conductor pads 125 and 130 are connected electrically to other portions of the circuit board 25 by way of, for example, the conductive lines 100 and 105 respectively. However, the conductor pads 135 and 140 are electrically floating. The component 50 is both metallurgically and electrically connected to the conductor pads 125 and 130 by solder structures 145 and 150 respectively. The solder structures 145 and 150 project through respective openings 155 and 160 in a solder resist or solder mask 165 that is applied to the circuit board 25. The component 50 is electrically connected to the solder structures 145 and 150. Solder structures 170 and 175 are metallurgically connected to the conductor pads 135 and 140, respectively, and project through respective openings 180 and 185 in the solder mask 165. The component 75 is metallurgically connected to the solder structures 170 and 175.

The component 75 and those like it positioned around the perimeter 60 of the circuit board 25 depicted in FIG. 1, are deliberately fabricated with a higher elevation than the component 50. To illustrate the relationships between the various elevations of the relevant components, it may be useful to use an upper surface 190 of the circuit board 25 as a reference plane. An upper surface 195 of the semiconductor chip 30 projects above the upper surface 190 by some elevation $z_1$. The component 50 projects above the upper surface 190 by some elevation $z_2$. The maximum vertical projection $z_2$ of the component 50 may correspond to the highest elevation of one or the other of the solder structures 145 and 150 or the top of the component 50 in the event that the solder structures 145 and 150 do not extend beyond the upper surface of the component 50. In this illustrative embodiment, the solder structure 145 is depicted as projecting slightly above the component 50, and thus represents the upper elevation $z_2$ of the overall component 50. However, the solder structure 170 of the component 75 projects above the upper surface 190 by an elevation $z_3$ that is deliberately selected to be larger than the elevation $z_2$ of the highest point of the component 50. Again this value $z_3$ may correspond to the top of the component 75 itself or the highest point of either the solder structure 170 or the solder structure 175 or both if they happen to have the exact same height. The purpose of deliberately fabricating the elevation $z_3$ to be larger than $z_2$ is to guard against the heat sink 20 rocking to one side or the other and electrically contacting one or the other of the solder structures 145 and 150, which might result in a short. Instead, due to the larger elevation $z_3$, if the heat sink 20 rocks in the direction of the arrow 200, the electrically floating component 75, and in this example the solder structures 170 and 175, will act as a mechanical stop or shim to prevent the heat sink 20 from contacting the portions of the component 50 such as the solder structures 145 and 150.

Figure 3:
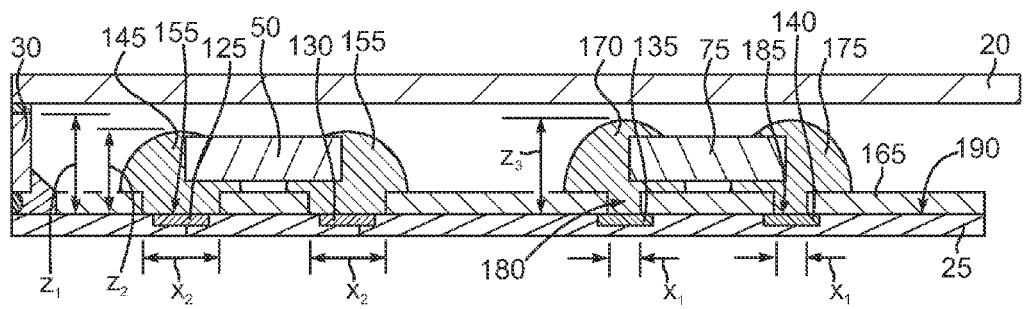
FIG. 3 is a portion of FIG. 2 shown at greater magnification.

Note the location of the dashed rectangle 205 in FIG. 2. The portion of FIG. 2 circumscribed by the dashed rectangle 205 will be shown at slightly greater magnification in FIG. 3. With that backdrop, attention is now turned to FIG. 3. Still referring momentarily also to FIG. 2, it should be noted that due to the location of the dashed rectangle 205, FIG. 3 depicts a small portion of the heat sink 20, a small portion of the circuit board 25, a small portion of the semiconductor chip 30 as well as the components 50 and 75 and their corresponding solder structures 145, 150, 170 and 175. Here, the aforementioned elevations $z_1$, $z_2$ and $z_3$ may be more readily observed. A variety of techniques may be used to establish the desired elevation $z_3$ and of course the desired differential between $z_3$ and $z_2$. In this illustrative embodiment, the solder structures 170 and 175 may be fabricated with greater elevations, say $z_3$, than the solder structures 145 and 150 by fabricating the openings 180 and 185 in the solder mask 165 with some lateral dimension $x_1$ that is smaller than the lateral dimensions $x_2$ of the openings 155 and 160 in the solder mask 165 for the solder structures 145 and 150. A technical goal of providing the openings 180 and 185 with relatively smaller dimensions $x_1$ than the openings 125 and 130 with dimensions $x_2$ is to provide a smaller volume for the solder structures 170 and 175 to invade vertically during reflow. This will aid in forcing the solder structures 170 and 175 to remain relatively taller than the solder structures 145 and 150 during reflow. The technique of fabricating solder mask openings that are smaller in lateral dimension than the underlying conductor pads 135 and 140 is commonly termed "solder mask definition" whereas the technique of fabricating the openings 155 and 160 larger than the underlying conductor pads 125 and 130 is commonly termed "non-solder mask definition." However, it may be possible to provide a sufficient differential between the lateral dimensions $x_1$ and $x_2$, for example, to encourage the requisite vertical extent $z_3$ of the solder structures 170 and 175 relative to $z_2$ by utilizing other than solder mask definition for the openings 180 and 185. Any of the openings 155, 160, 180 and 185 may have footprints that are circular, rectangular or other shapes. Accordingly the lateral dimensions $x_1$ and $x_2$ may constitute diameters, widths, lengths or other dimensions. This follows for the other openings disclosed herein.

As noted in the Background section hereof, a potential pitfall of using a thinned die along with passive components that are connected to an upper side of a package substrate is a potential for short circuiting with an overlying heat sink that has rotated relative to the package substrate due to asymmetric loading or other mechanism. In this regard, attention is now turned to FIG. 4, which is a sectional view like FIG. 2, but of a conventional arrangement of the circuit board 15 and the heat sink 20 and a conventionally fabricated semiconductor chip device 210. Here, the semiconductor chip device 210 includes a circuit board 225 and a semiconductor chip 230 mounted thereon. The circuit board 225 includes sets of solder structures 245 and 255 holding components 250. The solder structures 245 and 255 are all fabricated with the same elevation $z_2$ relative to the circuit board 225 and in electrical contact with the metallization lines 257 in the circuit board 225. Since the thinned semiconductor chip 230 has the elevation $z_1$, any rocking of the heat sink 20, say in the direction of the arrow 200, may result in the heat sink 20 contacting, for example, the solder structure 255 most distant from the semiconductor chip 230. The contact may produce an electrical short and a bad outcome for the conventional semiconductor chip device 210.

Figure 4:
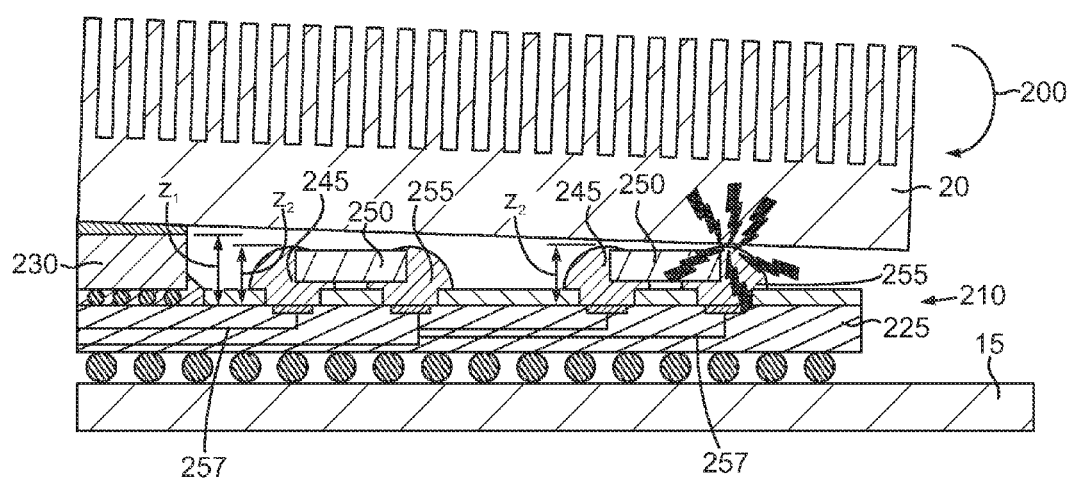
FIG. 4 is a sectional view like FIG. 2, but of an exemplary conventional semiconductor chip device and heat sink that illustrates a potential failure mode.

An exemplary method for fabricating the circuit board 25, and in particular the facets thereof associated with the components 50 and 75 for example, may be understood by referring now to FIGS. 4, 5, 6, 7 and 8 and initially to FIG. 4. FIG. 4 is a sectional view like FIG. 3 but prior to the various processing steps to yield all of the structures shown in FIG. 3. For example, FIG. 4 depicts the circuit board 25 following the fabrication of the conductor pads 125, 130, 135 and 140 and the application of the solder mask 165. The conductor pads 125, 130, 135 and 140 as well as the conductor lines 100 and 105 may be fabricated using well known techniques for fabricating interconnect structures, such as sputter deposition, plating, chemical vapor deposition, combinations of these or other techniques. Such techniques may be additive or subtractive. Exemplary materials include copper, silver, nickel, platinum, gold, aluminum, palladium, alloys or laminates of these or the like The solder mask 165 may be composed of a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd. Optionally, other materials, such as various epoxies or polymers such as polyimide, may be used. The solder mask 165 is lithographically patterned to establish the openings 155 and 160 over the conductor pads 125 and 130 respectively and the openings 180 and 185 over the conductor pads 135 and 140 respectively. In this illustrative embodiment, the openings 155 and 160 may be fabricated with lateral dimensions $x_2$ such that the conductor pads 125 and 130 are non-solder mask defined and the openings 180 and 185 may be fabricated with lateral dimensions $x_1$ such that the conductor pads 135 and 140 are solder mask defined.

Figure 5:
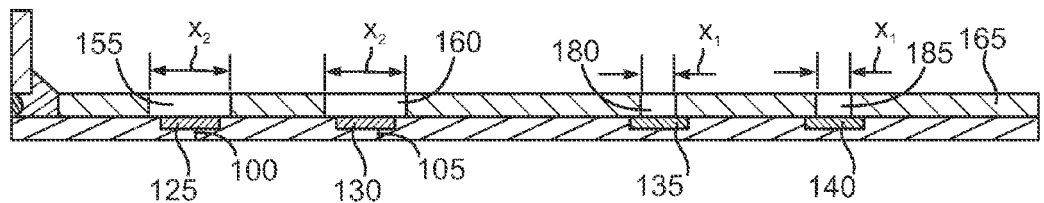
FIG. 5 is a sectional view like FIG. 3, but depicting earlier stage processing, namely, fabrication of openings in a solder resist layer.

Next and as depicted in FIG. 5, an appropriate stencil 300 may be positioned on the solder mask 165. The stencil 300 is fabricated with a pattern of openings, such as openings 305 and 310, that are designed to line up with the openings 155 and 160 in the solder mask 165 and other openings 315 and 320 that are positioned to be vertically aligned with the openings 180 and 185. The openings 305 and 310 may be fabricated with some lateral dimension $x_3$ that may be the same, smaller or larger than the lateral dimensions ($x_2$ see FIG. 5) of the openings 155 and 160. The lateral dimensions $x_4$ of the openings 315 and 320 should be larger than the lateral dimensions $x_1$ (see FIG. 5) of the openings 180 and 185. The point of making the openings 315 and 320 somewhat larger than the openings 180 and 185 is to enable the deposition of sufficient quantities of solder paste so that the post reflow height $z_3$ depicted in FIG. 3 is obtained.

Figure 6:
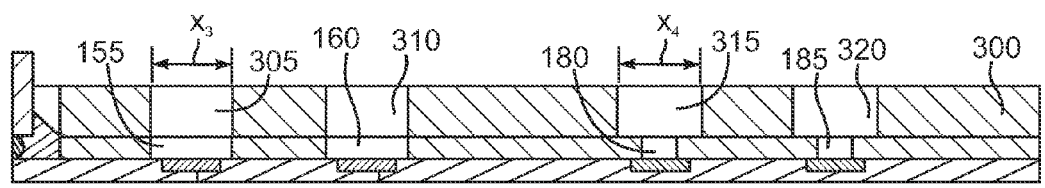
FIG. 6 is a sectional view like FIG. 5, but depicting application of a solder stencil.
Figure 7:
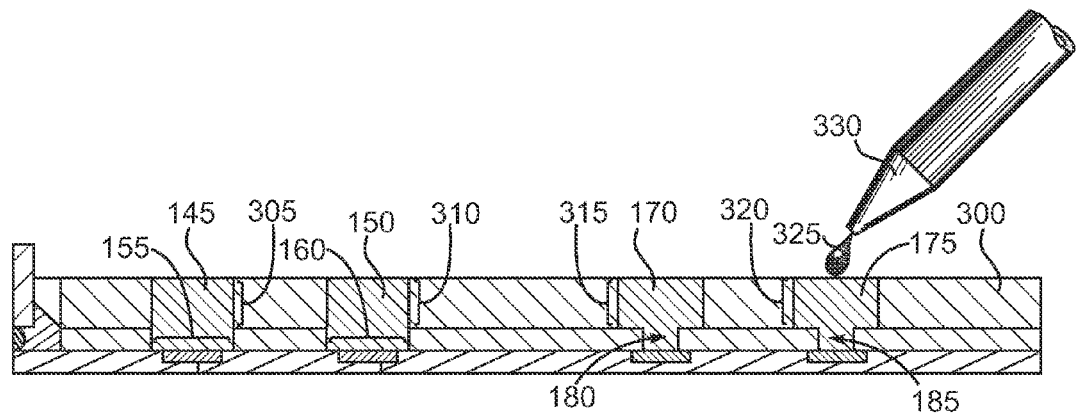
FIG. 7 is a sectional view like FIG. 6, but depicting exemplary solder paste application.
Figure 8:
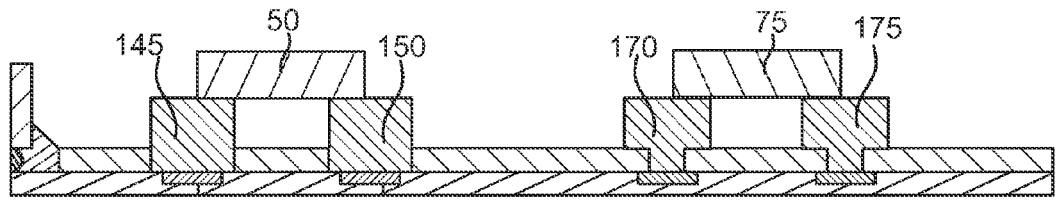
FIG. 8 is a sectional view like FIG. 7, but depicting component mounting.

Next and as shown in FIG. 6, solder paste 325 is deposited from an applicator 330 of one sort or another to fill the combination of the openings 155 and 305, 160 and 310, 180 and 315 and 185 and 320 to establish the solder structures 145, 150, 170 and 175 in paste form. The solder paste 325 may be composed of lead-free solders, such as tin-silver, tin-copper or the like. In an exemplary embodiment, the solder paste 325 may include about 97% tin and about 3% silver. Next and as shown in FIG. 7, the stencil 300 shown in FIG. 6 is removed and the components 50 and 75 are positioned on the solder structures 145 and 150 and 170 and 175, respectively, which at this point are still in paste form. Next and as depicted in FIG. 8, the solder structures 145, 150, 170 and 175 are subject to a reflow process to establish metallurgical bonding with the components 50 and 75 and set the heights $z_2$ and $z_3$ where $z_3$ is greater than $z_2$ as described above. The reflow parameters will depend on the melting temperature of the solder. In an exemplary embodiment, the solder structures 145 and 150 and 170 and 175 may be heated to about 250° C. for about 15 minutes to accomplish the reflow. Again, the height $z_3$ will advantageously be greater than $z_2$ but less than $z_1$, that is, the height of the semiconductor chip 30. Of course the reflow process also establishes metallurgical bonding between the solder structures 145, 150, 170 and 175 and the underlying pads 125, 130, 135 and 140, respectively.

Figure 9:
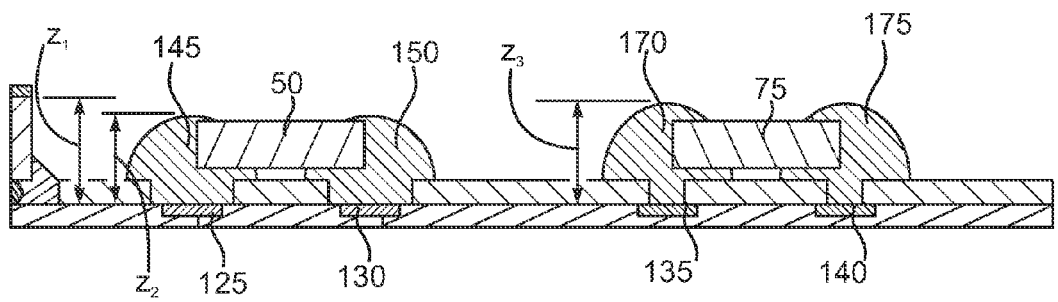
FIG. 9 is a sectional view like FIG. 8, but depicting post component solder reflow.
Figure 10:
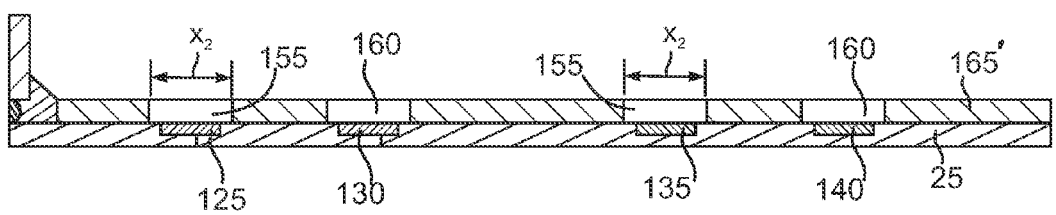
FIG. 10 is a sectional view like FIG. 5, but depicting an alternate exemplary fabrication of openings in a solder resist layer.
Figure 11:
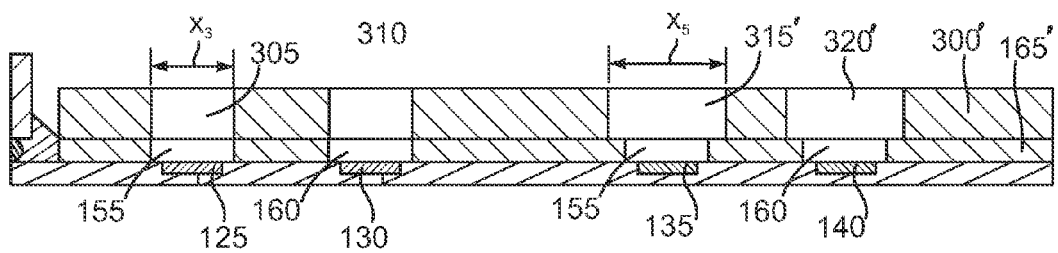
FIG. 11 is a sectional view like FIG. 10, but depicting an exemplary application of a solder stencil.
Figure 12:
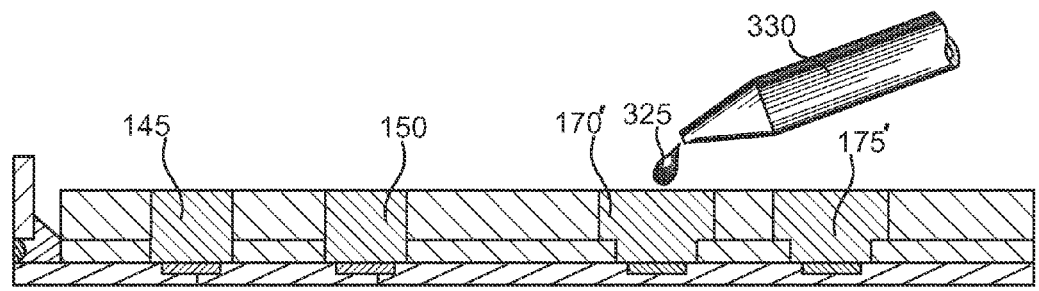
FIG. 12 is a sectional view like FIG. 11, but depicting solder paste application.

An alternate exemplary fabrication process may be understood by referring now to FIGS. 9, 10, 11 and 12 and initially to FIG. 9. FIG. 9 is a sectional view like FIG. 4 and thus depicts the circuit board 25 and the conductor pads 125, 130, 135 and 140. Here, a solder mask 165' may be applied to the circuit board 25 and be composed of the materials described elsewhere herein for solder masks. However, this alternative solder mask 165' is patterned with openings 155 and 160 but not only the conductor pads 125 and 130 but also the conductor pads 135 and 140. In other words, the openings 155 and 160 having the same lateral dimension $x_2$ may be used for not only the electrically active conductor pads 125 and 130 but also the electrically floating pads 135 and 140. Since the same sized openings are used for the inactive pads 135 and 140, another measure will be needed to ensure that adequate volumes of solder paste are positioned above the pads 135 and 140 to achieve the desired height $z_3$ as described elsewhere herein. Here, and as shown in FIG. 10, a stencil 300' may be positioned on the solder mask 165'. The stencil 300' may have the openings 305 and 310 that are aligned with the openings 155 and 160 over the pads 125 and 130. In addition, the stencil 300' has openings 315' and 320' that are positioned in alignment with the openings 155 and 160 over the pads 135 and 140 but with lateral dimensions $x_5$, which may be as large as necessary to achieve a requisite volume of solder paste while utilizing the standard sizes $x_2$ for the openings 155 and 160. Next and as shown in FIG. 11, a solder paste 325 may be applied by the applicator 330 to establish the solder structures 145 and 150 and solder structures 170' and 175'. The solder paste 325 may be composed of lead-free solders, such as tin-silver, tin-copper or the like. In an exemplary embodiment, the solder paste 325 may be about 97% tin and about 3% silver. Next and as shown in FIG. 10, the stencil 300' depicted in FIG. 11 may be removed and a reflow process performed with the components 50 and 75 in position to thereafter establish the basic structure depicted in FIG. 2, albeit utilizing the common sized openings 155 and 160. The reflow parameters will depend on the melting temperature of the solder. In an exemplary embodiment, the solder structures 145 and 150 and solder structures 170' and 175' may be heated to about 250° C. for about 15 minutes to accomplish the reflow.

In still another alternative, a component may be attached to a circuit board with a greater elevation than an electrically connected component inward from it by using for example a solder paste that has a lower rate of compaction during reflow then a solder paste used from those components that are going to be electrically connected to other structures.

Figure 13:
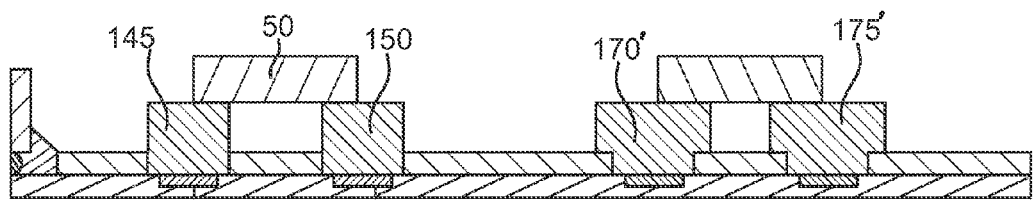
FIG. 13 is a sectional view like FIG. 12, but depicting component placement.
Figure 14:
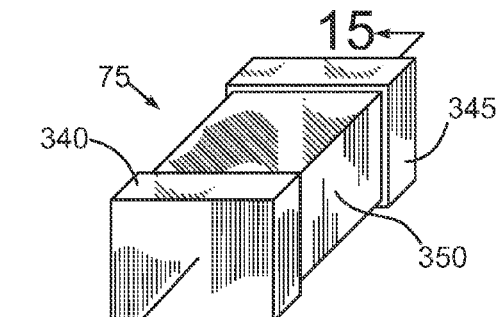
FIG. 14 is a pictorial view of an exemplary embodiment of a component that may be used with any of the disclosed embodiments.
Figure 15:
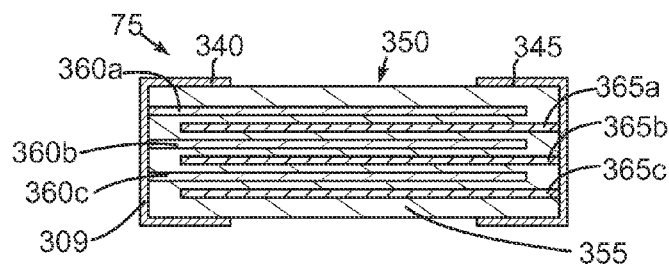
FIG. 15 is a sectional view of FIG. 14 taken at section 15-15.

Any of the disclosed embodiments may use a variety of different components in order to provide both electrically functional components as well as the electrically non-functional components. Examples include capacitors, inductors, or other devices. If desired, something other than an electronic device could be used for those components that are electrically non-functional. For example, a small piece of silicon or other semiconductor might be used or perhaps even a small piece of metal that may be soldered to the circuit board might substitute for an actual electrically inactive passive component. In an illustrative embodiment, the components such as the components 50 and 75 may be fabricated as capacitors. The usage of capacitors for the dummy components lends to easy integration with existing component attach schemes. FIG. 13 shows a pictorial view of an exemplary capacitor 75, which is illustrative of the component 50 as well and may typify the other disclosed components. Here the capacitor 75 includes a pair of spaced apart external terminals 340 and 345 that bracket a central portion 350. Additional details of the component 75 may be understood by referring now also to FIG. 14, which is a sectional view of FIG. 13 taken at section 14-14. The central portion 350 consists of an insulating material 355 that is interspersed among parallel capacitor plates 360a, 360b and 360c that are interwoven with capacitor plates 365a, 365b and 365c. The plates 360a, 360b and 360c are connected to the external terminal 340 and the plates 365a, 365b and 365c are connected to the external terminal 345. The external terminals 340 and 345 may be fabricated from various conductor materials, such as copper, silver, gold, palladium, platinum, gold-tin alloy, nickel, tantalum nitride, titanium-tungsten, mixtures of these or the like. The plates 360a, 360b, 360c, 365a, 365b and 365c may be composed of a variety of materials. In an exemplary embodiment, a copper powder is mixed with various ceramic powders, such as silica or boron oxide or both and a solvent. Silver, gold, palladium, platinum, gold-tin alloy, nickel, tantalum nitride, titanium-tungsten, mixtures of these or the like may optionally be used as the base conductor. The insulating material 355 is advantageously formed from high dielectric constant or so-called "high K" ferroelectric materials suitable to serve as the capacitor dielectric layers disclosed elsewhere herein. Exemplary materials include, for example, barium titanate, strontium titanate, magnesium titanate, barium neodymium titanate, barium strontium titanate, calcium magnesium titanate, tantalum oxide, titanate, zirconium tin titanate or the like. Additives, such as alumina, magnesia, berylia, calcium, corderite ($Mg+Al+SiO_2$), forsterite, niobate, silica, zirconia, boro-silicate or the like may be used to modify the high temperature and dielectric constant properties of the insulating material 346. The insulating material may be formed from layers of a sheet or a tape. Commercially available examples are known in the industry as "green sheets" or "green tapes." After stacking with the plates 360a, 360b and 360c, 365a, 365b and 365c and the terminals 340 and 345 a baking process is performed to fuse the multiple sheets into a unitary structure and ohmically connect up the terminals 340 and 345. In this illustrative embodiment, the capacitor 75 includes two external terminals 340 and 345 and six plates 360a, 360b, 360c, 365a, 365b and 365c. However, it should be understood that the capacitor 75 can take on a myriad of configurations involving different numbers and types of overlapping conductors and terminals and terminations, etc.

Any of the exemplary embodiments disclosed herein may be embodied in instructions disposed in a computer readable medium, such as, for example, semiconductor, magnetic disk optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling an electrically non-functional component to a surface of a first circuit board, the electrically non-functional component having a first elevation, the surface of the circuit board adapted to have a semiconductor chip mounted thereon; and
   coupling an electrically functional component to the surface inward from the electrically non-functional component, the electrically functional component having a second elevation less than the first elevation.

2. The method of claim 1, comprising mounting the semiconductor chip on the surface.

3. The method of claim 2, comprising positioning a heat sink in thermal contact with the semiconductor chip.

4. The method of claim 3, comprising positioning the heat sink on the semiconductor chip.

5. The method of claim 1, wherein the electrically non-functional component comprises a capacitor.

6. The method of claim 1, wherein the electrically non-functional component comprises a piece of a semiconductor or metallic material.

7. The method of claim 1, wherein the electrically functional component comprises a capacitor.

8. The method of claim 1, wherein the first circuit board comprises a semiconductor chip package substrate.

9. The method of claim 8, comprising coupling the first circuit board to a second circuit board.

10. A method of manufacturing, comprising:
    coupling an electrically non-functional component to a surface of a circuit board, the electrically non-functional component having a first elevation;
    coupling an electrically functional component to the surface inward from the electrically non-functional component, the electrically functional component having a second elevation less than the first elevation; and
    coupling a semiconductor chip to the surface inward from the electrically functional component.

11. The method of claim 10, comprising thinning the semiconductor chip prior to mounting to the surface.

12. The method of claim 10, comprising positioning a heat sink in thermal contact with the semiconductor chip.

13. The method of claim 12, comprising positioning the heat sink on the semiconductor chip.

14. The method of claim 10, wherein the electrically non-functional component comprises a capacitor.

15. The method of claim 10, wherein the electrically non-functional component comprises a piece of a semiconductor or metallic material.

16. The method of claim 10, wherein the electrically functional component comprises a capacitor.

17. An apparatus, comprising:
    a first circuit board having a surface adapted to have a semiconductor chip mounted thereon;
    an electrically non-functional component coupled to the surface and having a first elevation; and
    an electrically functional component coupled to the surface inward from the electrically non-functional component, the electrically functional component having a second elevation less than the first elevation.

18. The apparatus of claim 17 comprising the semiconductor chip mounted on the surface.

19. The apparatus of claim 18, comprising a heat sink in thermal contact with the semiconductor chip.

20. The apparatus of claim 17, wherein the electrically non-functional component comprises a capacitor.

21. The apparatus of claim 17, wherein the electrically non-functional component comprises a piece of a semiconductor or metallic material.

22. The apparatus of claim 17, wherein the electrically functional component comprises a capacitor.

23. The apparatus of claim 17, wherein the first circuit board comprises a semiconductor chip package substrate.

24. The apparatus of claim 17, comprising a second circuit board coupled to the first circuit board.

* * * * *